(12) United States Patent
Ichikawa

(10) Patent No.: US 6,847,082 B2
(45) Date of Patent: Jan. 25, 2005

(54) SEMICONDUCTOR INTEGRATED DEVICE INCLUDING AN ELECTROSTATIC BREAKDOWN PROTECTION CIRCUIT HAVING UNIFORM ELECTROSTATIC SURGE RESPONSE

(75) Inventor: Kenji Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/160,265

(22) Filed: Jun. 4, 2002

(65) Prior Publication Data

US 2002/0179971 A1 Dec. 5, 2002

(30) Foreign Application Priority Data

Jun. 4, 2001 (JP) ........................................ 2001-168087

(51) Int. Cl.[7] ............................. H01L 27/01; H01L 23/62
(52) U.S. Cl. ..................... 257/353; 257/349; 257/354; 257/355

(58) Field of Search ..................................... 257/347–363

(56) References Cited

U.S. PATENT DOCUMENTS

| 4,928,159 A | * | 5/1990 | Mihara et al. ............... 257/370 |
| 5,545,909 A | * | 8/1996 | Williams et al. ............. 257/355 |
| 5,852,315 A | * | 12/1998 | Ker et al. .................... 257/355 |
| 6,420,761 B1 | * | 7/2002 | Gauthier et al. ............. 257/360 |
| 6,424,013 B1 | * | 7/2002 | Steinhoff et al. ............ 257/355 |

* cited by examiner

*Primary Examiner*—Ori Nadav
(74) *Attorney, Agent, or Firm*—Volentine Francos & Whitt, PLLC

(57) ABSTRACT

A semiconductor integrated device having a source region and a drain region of a first conductive type, a channel region of a second conductive type which is located between the source and drain regions. The channel region having a highly doped impurity region of the second conductive type which is surrounded by a lightly doped impurity region of the second conductive type.

13 Claims, 9 Drawing Sheets

SEMICONDUCTOR INTEGRATED DEVICE INCLUDING AN ELECTROSTATIC BREAKDOWN PROTECTION CIRCUIT HAVING UNIFORM ELECTROSTATIC SURGE RESPONSE

CROSS REFERENCE TO RELATED APPLICATION

The present application claims priority under 35 U.S.C. §119 to Japanese Patent Application No. 2001-168087, filed on Jun. 4, 2001, which is herein incorporated by reference in its entirely for all purposes.

BACKGROUND OF THE INVENTION

1. Field of the Invention

The present invention relates to an electrostatic damage protection circuit provided in a semiconductor integrated device to prevent an electrostatic breakdown.

2. Description of the Related Art

Recently, field effect transistors have been formed on an SOI substrate (an SOI-FET) instead on a conventional bulk semiconductor substrate. The SOI-FET is formed in the thin silicon layer (the SOI layer) formed on the insulating layer. Since the SOI-FET is perfectly isolated by the insulating layer and an isolating layer (a field layer), a parasitic capacitance of the SOI-FET is reduced. The insulating layer is for example, a buried oxide layer (a BOX layer). And, since a body region is fully or partly depleted due to the thin SOI layer, the SOI-FET can have a precipitous or steep sub-threshold characteristic. Therefore, the SOI-FET can operate with high speed and improved power savings. Also, since formation of a parasitic bipolar is prevented due to the perfectly isolated structure, latch up can be inhibited. The body region is P type when the SOI-FET is a NMOS transistor, and is a N type when the SOI-FET is PMOS transistor.

By the way, a kink phenomenon is well known as one of the demerits of the SOI-FET. Since a body voltage rises when a drain potential rises, a bipolar current increases. Therefore, a drain current increases. Such a phenomenon is called the kink phenomenon. This kink phenomenon is typical of the SOI-FET which has a floating body region. As a countermeasure against such kink phenomenon, a body contact method is well known such that the body voltage is fixed.

FIG. 16 is a plan view showing the structure of a conventional NMOS transistor which is a body contact type having an electrostatic breakdown protection circuit. A gate electrode 60G crosses over an N type impurity region 60N which includes source and drain regions, and is connected to a metal wiring 60M which supplies a gate potential, through a contact hole 61C. One end of the gate electrode 60G overlaps a P type impurity region 60P, which has an opposite conductive type as that of the source and drain regions 60N. The P type impurity region 60P is connected to a metal wiring 63M which supplies a body potential, through contact holes 60C. A metal wiring 61M supplies a source potential. A metal wiring 62M supplies a drain potential. As a result, since the body voltage is fixed to the source potential or a negative potential, the kink phenomenon in the NMOS transistor can be inhibited.

Recently, a dynamic threshold MOS (DTMOS) which is one of the body contact type MOS transistors has been considered. FIG. 17 is a plan view showing a conventional DTMOS transistor having an electrostatic breakdown protection circuit. A gate electrode 70G crosses over an N type impurity region 70N which includes source and drain regions, and is connected to a metal wiring 70M which supplies a gate potential, through a contact hole 71C. The metal wiring 70M overlaps with the gate electrode 70G and extends along the gate electrode 70G. One end of the gate electrode 70G overlaps a P type impurity region 70P which has an opposite conductive type than that of the source and drain regions 70N. The P type impurity region 70P is connected to the metal wiring 70M through contact holes 70C. A metal wiring 71M supplies a source potential. A metal wiring 72M supplies a drain potential. As a result, since a threshold voltage falls due to a bias effect occurring when the gate voltage is applied, the DTMOS transistor can operate at a low power and with high speed.

By the way, an output transistor (an output buffer) which has a wide gate width in general, is located at an output terminal of a semiconductor integrated device. Since a surge (e.g., a static electricity) may be applied to the output terminal, a protection transistor having a gate electrode fixed to a source potential (the gate electrode is an OFF state), is connected in parallel with the output transistor. Therefore, an electrostatic breakdown protection property against the electrostatic surge is improved.

Next, an operation of the DTMOS transistor which consists of an NMOS transistor will be described below. Since the body potential rises due to a breakdown occurring when the electrostatic surge is applied from the drain region, a potential between the body region and the source region becomes forward biased. As a result, a surge current flows to the source region due to a bipolar operation. At that time, since the gate voltage also rises in concurrence with the breakdown, a channel forms in a boundary face of the body region. As a result, since a base current increases due to carrier recombination, bipolar operation is able to occur the bipolar operation effectively.

As shown in FIG. 17, in the conventional DTMOS transistor, since the P type impurity region 70P which fixes the body potential is located at one end of the N type impurity region 70N, a response for each of the DTMOS transistors which are formed in the same active region differs. In addition, the output transistor has the wide gate width, so that protection against the electrostatic breakdown more difficult.

SUMMARY OF THE INVENTION

The present invention is therefore directed to a semiconductor device having an electrostatic breakdown protection circuit that overcomes one or more of the problems due to the limitations and disadvantages of the related art.

In a semiconductor integrated device having an electrostatic breakdown protection circuit according to the present invention, a source region and a drain region of a first conductive type, a channel region of a second conductive type which is located between the source and drain regions. The channel region having a highly doped impurity region of the second conductive type which is surrounded by a lightly doped impurity region of the second conductive type.

According to the present invention, a gate potential can be applied to the body region of all the transistors which are formed across the active region uniformly, and responses against the electrostatic surges can be equalized so that the surge current flows out each of the transistors uniformly. Therefore, the electrostatic protection property against the electrostatic surge can be improved.

The above and further objects and novel features of the invention will more fully appear from the following detailed description, appended claims and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts in order that the present invention will be easily understood.

Figure 1:
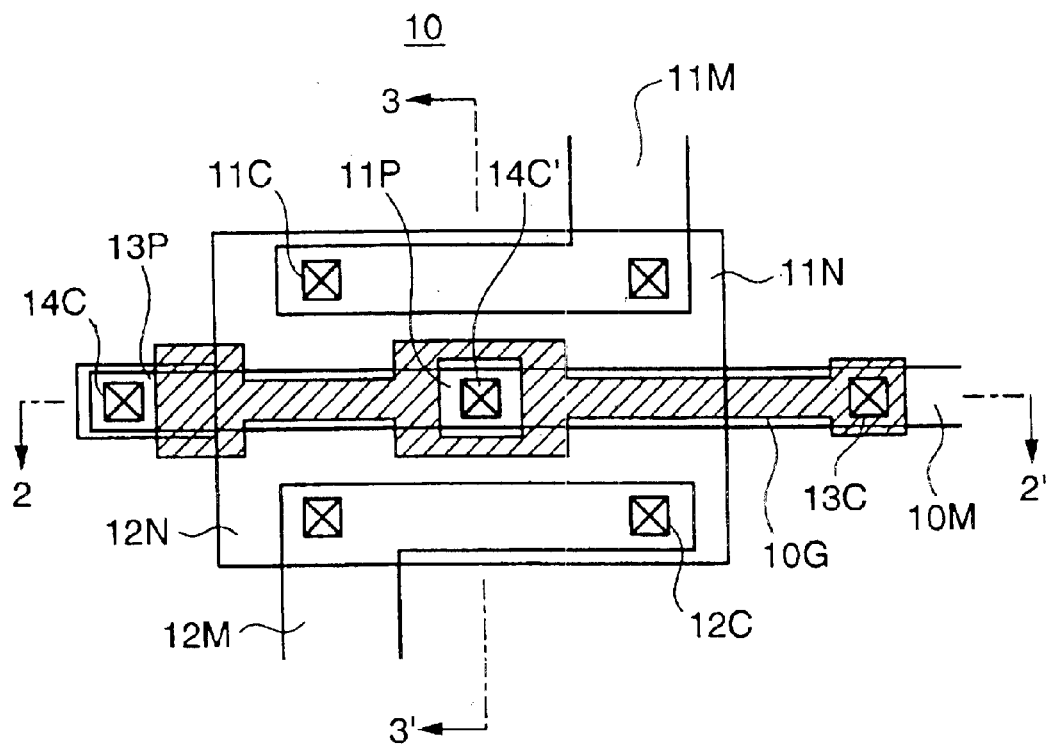
FIG. 1 is a plan view showing the structure of a semiconductor integrated device having an electrostatic breakdown protection circuit according to a first preferred embodiment of the present invention.
Figure 2:
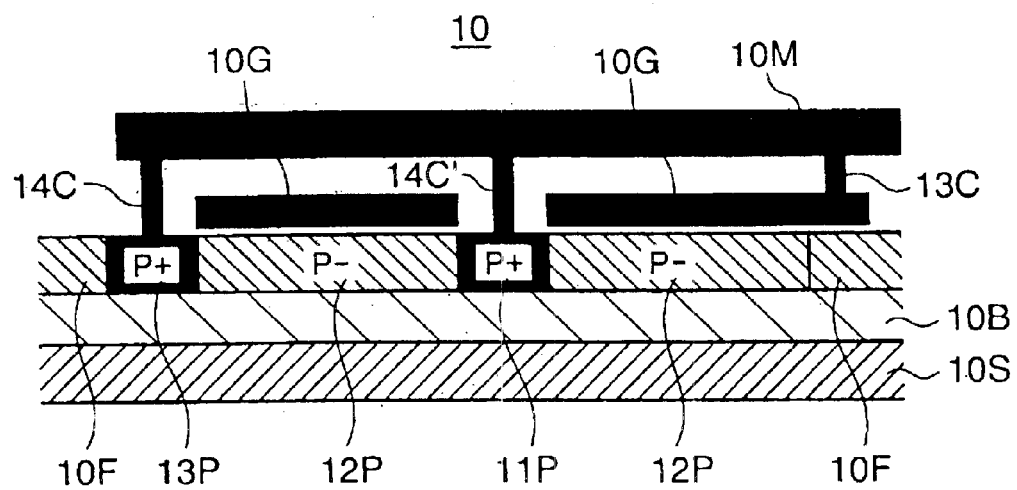
FIG. 2 is a cross-sectional view along the line 2–2' in FIG. 1, which shows the structure of the semiconductor integrated device having the electrostatic breakdown protection circuit according to the first preferred embodiment of the present invention.
Figure 3:
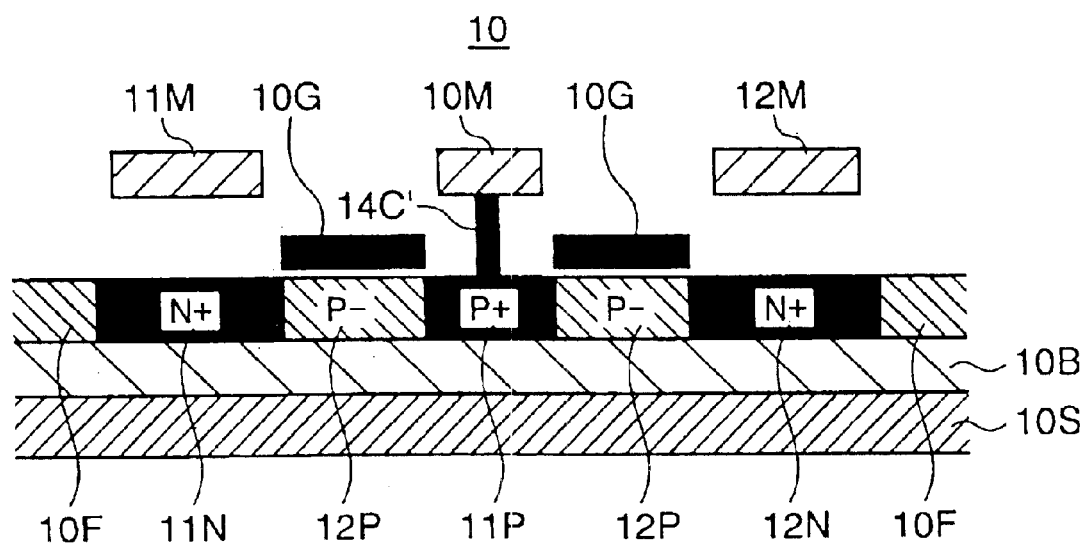
FIG. 3 is a cross-sectional view along the line 3–3' in FIG. 1, which shows the structure of the semiconductor integrated device having the electrostatic breakdown protection circuit according to the first preferred embodiment of the present invention.

FIG. 1 is a plan view showing the structure of a semiconductor integrated device having an electrostatic breakdown protection circuit according to a first preferred embodiment of the present invention. FIG. 2 is a cross-sectional view along the line 2–2' in FIG. 1. FIG. 3 is a cross-sectional view along the line 3–3' in FIG. 1.

The semiconductor integrated device 10 is formed in an SOI substrate having a silicon substrate 10S, a BOX layer 10B which is formed on the silicon layer 10S, an N type impurity regions 11N and 12N which are isolated by the BOX layer 10B and an isolating region 10F (a field region 10F). A gate electrode 10G crosses over the P type body region between source and drain regions 11N and 12N. A metal wiring 10M which supplies a gate potential overlaps with the gate electrode 10G and extends along the gate electrode 10G within the N type impurity region 10N. A metal wiring 11M is electrically connected to the source region 11N through contact holes 11C, and supplies a source potential to the source region 11N. A metal wiring 12M is electrically connected to the drain region 12N through contact holes 12C, and supplies a drain potential to the drain region 12N. A highly doped P type impurity region 11P is located between source and drain regions 11N and 12N, and is exposed from the gate electrode 10G. A low-doped P type impurity region 12P is located between source and drain regions 11N and 12N and surrounds the highly doped impurity region 11P. A highly doped P type impurity region 13P is adjacent to the low-doped P type impurity region 12P. An ion concentration of the P type impurity regions 11P and 13P is higher than that of the P type impurity region 12P. The metal wiring 10M overlaps the highly doped P type impurity region 13P. The gate electrode 10G is electrically connected to the metal wiring 10M over the field region 10F, through a contact hole 13C. The metal wiring 10M is electrically connected to the P type impurity region 13P through a contact hole 14C, and is electrically connected to the P type impurity region 11P through a contact hole 14C'.

Next, an operation of the semiconductor integrated device 10 will be described below. When the electrostatic surge is applied from the metal wiring 12M to the drain region 12N, a body potential rises due to a breakdown occurring between the source and drain regions 11N and 12N. And, a gate potential rises through the P type impurity regions 11P and 13P. At that time, a channel is generated in the body region between the source and drain regions 11N and 12N (a boundary face) of the body region, and a base current increases due to a carrier recombination on the basis of the channel generation. As a result, bipolar operation occurs effectively and a surge current flows to the metal wiring 11M through the source region 11N.

According to the first preferred embodiment of the present invention, since the P type impurity regions 11P (which is formed between the source and drain regions 11N and 12N) and 13P (which is formed adjacent to the low-doped impurity region 12P) which fix the body potential are provided, all the transistors are turned on and bipolar operation can uniformly occur across the body regions of all the transistors which are formed across the active region between the source and drain regions 11N and 12N. As a result, responses against the electrostatic surges can be equalized so that the surge current flows out each of the transistors uniformly, and the electrostatic protection property against the electrostatic surge can be improved.

Furthermore, according to the first preferred embodiment of the present invention, the P type (highly doped) impurity region 11P which is exposed from the gate electrode 10G is merely formed in the device in a manner well known as conventional semiconductor integrated devices. Therefore, an area of the semiconductor integrated device according to the first preferred embodiment is almost equal to that of the conventional semiconductor integrated device.

Figure 4:
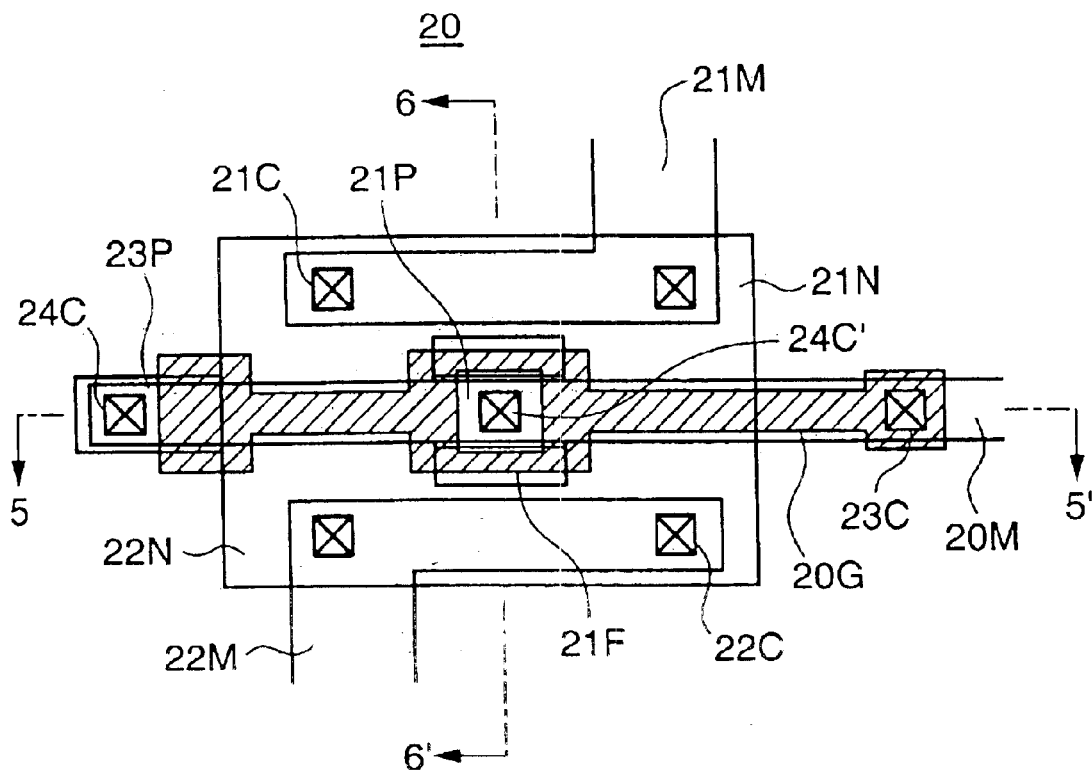
FIG. 4 is a plan view showing the structure of a semiconductor integrated device having an electrostatic breakdown protection circuit according to a second preferred embodiment of the present invention.
Figure 5:
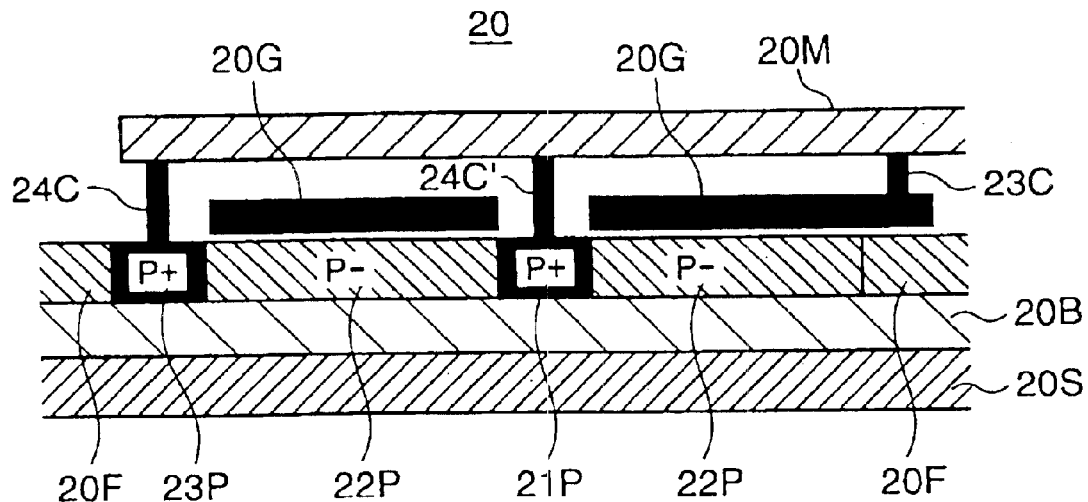
FIG. 5 is a cross-sectional view along the line 5–5' in FIG. 4, which shows the structure of the semiconductor integrated device having the electrostatic breakdown protection circuit according to the second preferred embodiment of the present invention.
Figure 6:
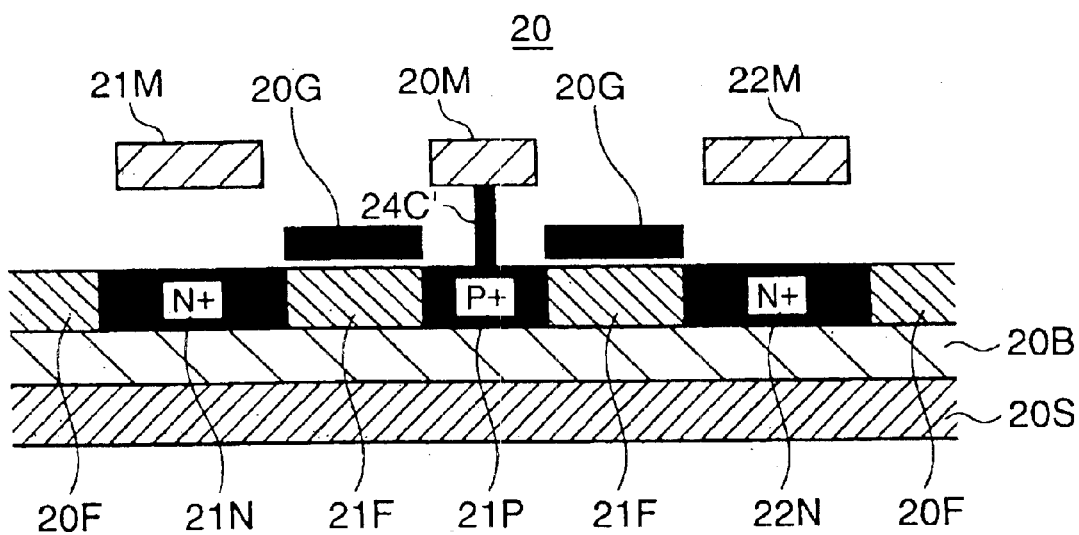
FIG. 6 is a cross-sectional view along the line 6–6' in FIG. 4, which shows the structure of the semiconductor integrated device having the electrostatic breakdown protection circuit according to the second preferred embodiment of the present invention.

FIG. 4 is a plan view showing the structure of a semiconductor integrated device 10 having an electrostatic breakdown protection circuit according to a second preferred embodiment of the present invention. FIG. 5 is a cross-sectional view along the line 5–5' in FIG. 4. FIG. 6 is a cross-sectional view along the line 6–6' in FIG. 4.

The semiconductor integrated device 20 is formed in an SOI substrate having a silicon substrate 20S, a BOX layer 20B which is formed on the silicon layer 20S, an N type impurity regions 21N and 22N which are isolated by the BOX layer 20B and an isolating region 20F (a field region 20F). A gate electrode 20G crosses over the P type body region in between source and drain regions 21N and 22N. A metal wiring 20M which supplies a gate potential overlaps with the gate electrode 20G and extends along the gate electrode 20G within the N type impurity region 20N. A metal wiring 21M is electrically connected to the source region 21N through contact holes 21C, and supplies a source potential to the source region 21N. A metal wiring 22M is electrically connected to the drain region 22N through contact holes 22C, and supplies a drain potential to the drain region 22N. A highly doped P type impurity region 21P is located between the source and drain regions 21N and 22N, and between a pair of low-doped P type impurity regions 22P which are located between the source and drain regions 21N and 22N. The highly doped P type impurity region 21P is exposed from the gate electrode 20G. A highly doped P type impurity region 23P is adjacent to the low-doped P type impurity region 22P. An ion concentration of the P type impurity regions 21P and 23P is higher than that of the P type impurity region 22P. The metal wiring 20M overlaps the highly doped P type impurity region 23P. The gate electrode 20G is electrically connected to the metal wiring 20M over the field region 20F, thorough a contact hole 23C. The metal wiring 20M is also electrically connected to the P type impurity region 23P through a contact hole 24C, and is electrically connected to the P type impurity region 21P through a contact hole 24C'.

Isolation regions 21F such as $SiO_2$ are formed between the source region 21N and the P type impurity region 21P and between the drain region 22N and the P type impurity region 21P.

Next, an operation of the semiconductor integrated device 20 will be described below. When the electrostatic surge is applied from the metal wiring 22M to the drain region 22N, a body potential rises due to a breakdown occurring between the source and drain regions 21N and 22N. And, a gate potential rises through the P type impurity regions 21P and 23P. At that time, a channel is generated in the body region between the source and drain regions 21N and 22N (a boundary face) of the body region, and a base current increases due to a carrier recombination on the basis of the channel generation. As a result, bipolar operation occurs effectively and a surge current flows to the metal wiring 21M through the source region 11N.

According to the second preferred embodiment of the present invention, since the P type impurity regions 21P (which is formed between the source and drain regions 21N and 22N) and 23P (which is formed adjacent to the low-doped impurity region 22P) which fix the body potential are provided, all the transistors are turned on so that bipolar operation uniformly occurs across the body regions of all the transistors which are formed across the active region between the source and drain regions 21N and 22N. As a result, responses against the electrostatic surges can be equalized so that the surge current flows out each of the transistors uniformly, and the electrostatic protection property against the electrostatic surge can be improved.

And, according to the second preferred embodiment of the present invention, the P type (highly doped) impurity region 21P which is exposed from the gate electrode 20G is merely formed in the device in manner well known as conventional semiconductor integrated devices. Therefore, an area of the semiconductor integrated device according to the second preferred embodiment is almost equal to that of the conventional semiconductor integrated device.

Furthermore, since the P type impurity region 21P is isolated from the source and drain regions 21N and 22N by the isolation regions 21 F, a parasitic diode is not generated. Therefore, a diode current between the body region, and the source and drain regions 21N and 22N can be prevented.

Figure 7:
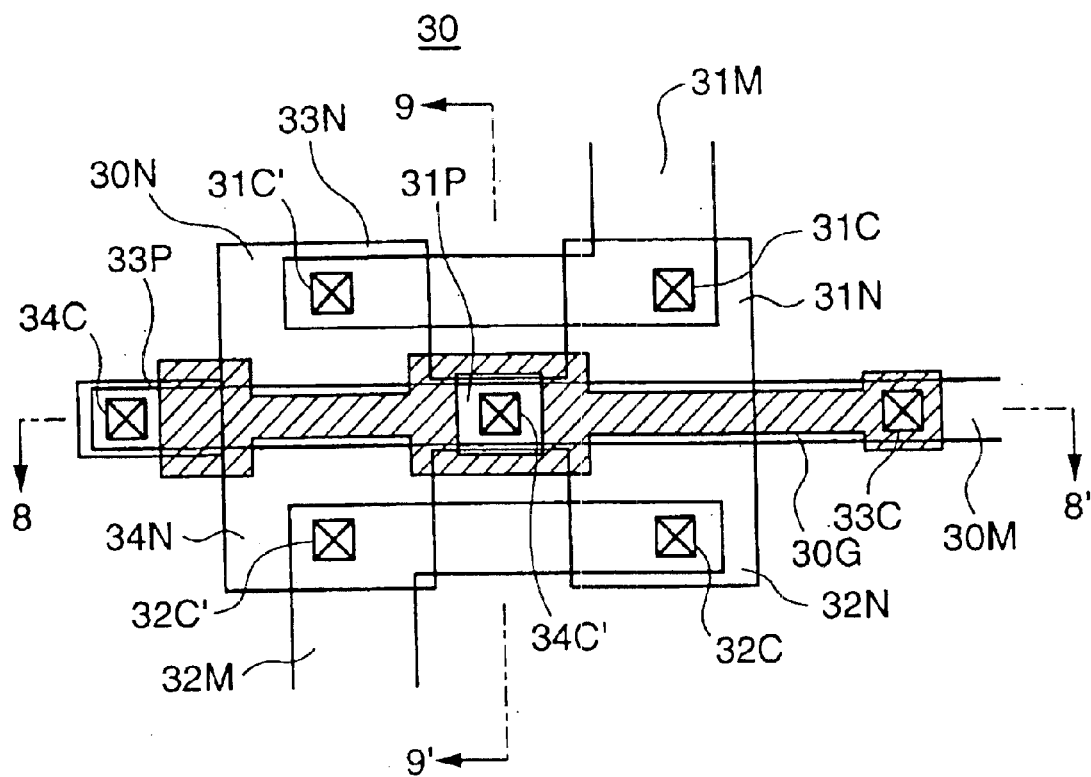
FIG. 7 is a plan view showing the structure of a semiconductor integrated device having an electrostatic breakdown protection circuit according to a third preferred embodiment of the present invention.
Figure 8:
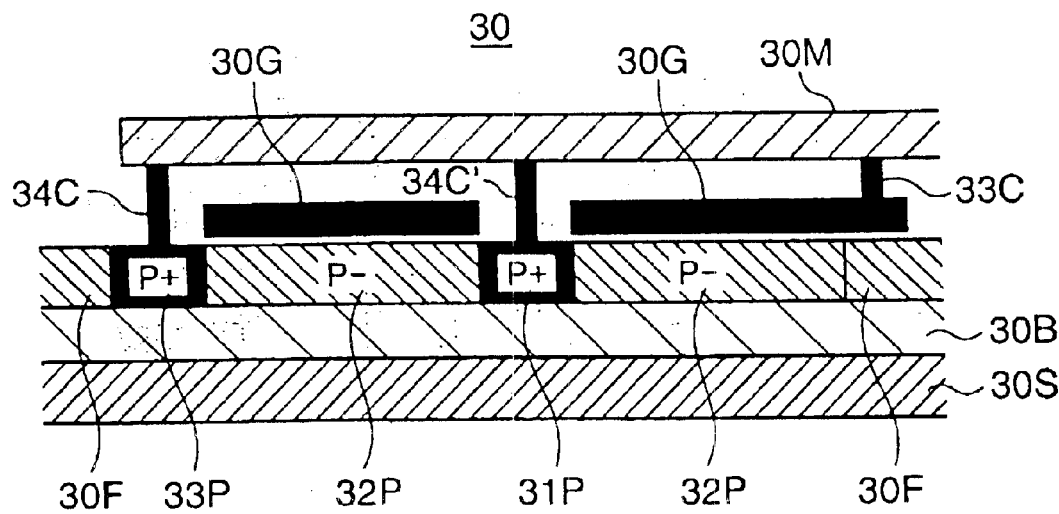
FIG. 8 is a cross-sectional view along the line 8–8' in FIG. 7, which shows the structure of the semiconductor integrated device having the electrostatic breakdown protection circuit according to the third preferred embodiment of the present invention.
Figure 9:
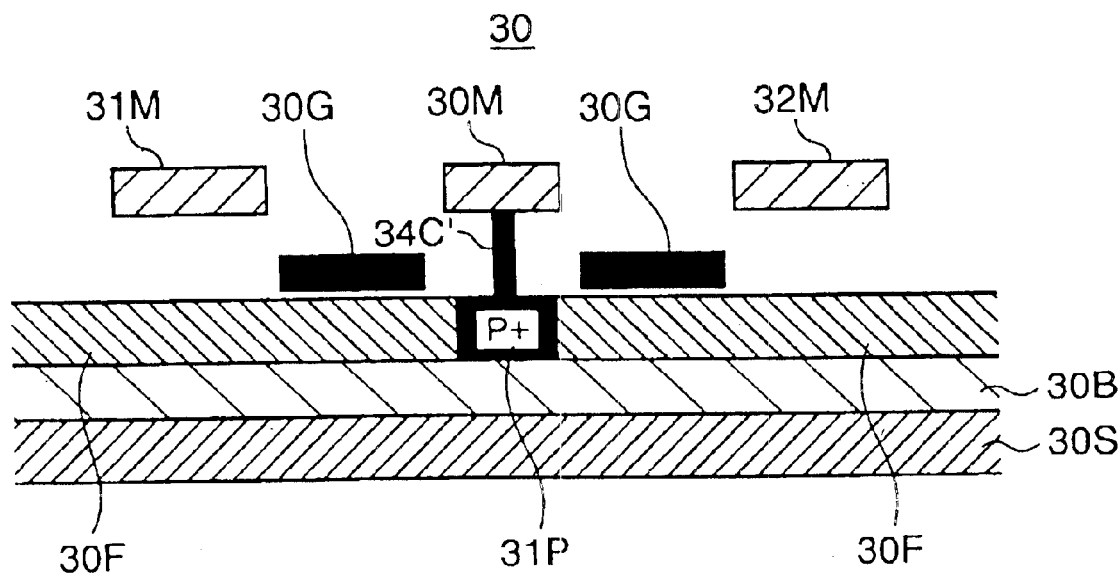
FIG. 9 is a cross-sectional view along the line 9–9' in FIG. 7, which shows the structure of the semiconductor integrated device having the electrostatic breakdown protection circuit according to the third preferred embodiment of the present invention.

FIG. 7 is a plan view showing the structure of a semiconductor integrated device 10 having an electrostatic breakdown protection circuit according to a third preferred embodiment of the present invention. FIG. 8 is a cross-sectional view along the line 8–8' in FIG. 7. FIG. 9 is a cross-sectional view along the line 9–9' in FIG. 7.

The semiconductor integrated device 30 is formed in an SOI substrate having a silicon substrate 30S, a BOX layer 30B which is formed on the silicon layer 30S, an N type impurity regions 31N, 32N, 33N and 34N which are isolated by the BOX layer 30B and an isolating region 30F (a field region 30F). A gate electrode 30G crosses over the P type body region in between source regions 31N and 33N and drain regions 32N and 34N. A metal wiring 30M which supplies a gate potential overlaps with the gate electrode 30G and extends along the gate electrode 30G within the N type impurity region 30N. A metal wiring 31M is electrically connected to the source region 31N through a contact hole 31C, and supplies a source potential to the source region 31N. The metal wiring 31M is also electrically connected to the source region 33N through a contact hole 31C', and supplies a source potential to the source region 33N. A metal wiring 32M is electrically connected to the drain region 32N through a contact hole 32C, and supplies a drain potential to the drain region 32N. The metal wiring 32M is electrically connected to the drain region 34N through a contact hole 32C', and supplies a drain potential to the drain region 34N. A highly doped P type impurity region 31P is located between the source and drain regions 31N and 32N and the source and drain regions 33N and 34N, and between a pair of low-doped P type impurity regions 32P which are located between the source and drain regions 31N and 32N, and also between the source and drain regions 33N and 34N. The highly doped impurity region 31P is exposed from the gate electrode 30G. A highly doped P type impurity region 33P is adjacent to the low-doped P type impurity region 32P. An ion concentration of the P type impurity regions 31P and 33P is higher than that of the P type impurity regions 32P. The metal wiring 30M also overlaps the highly doped P type impurity region 33P. The gate electrode 30G is electrically connected to the metal wiring 30M over the field region 30F, thorough a contact hole 33C. The metal wiring 30M is also electrically connected to the P type impurity region 33P through a contact hole 34C, and is electrically connected to the P type impurity region 31P through a contact hole 34C'.

Additionally, the isolation region 30F extends between the source regions 31N and 33N to the side surface of the P type impurity region 31P, and extends between the drain regions 32N and 34 N to the other side surface of the P type impurity region 31P.

Next, an operation of the semiconductor integrated device 30 will be described below. When the electrostatic surge is entered from the metal wiring 32M to the drain region 32N, a body potential rises due to a breakdown occurring between the source and drain regions 31N and 32N, and between the source and drain regions 33N and 34N. And, a gate potential rises through the P type impurity regions 31P and 33P. At that time, a channel is generated in the body region between the source regions 31N and 33N, and the drain regions 32N and 34N (a boundary face) of the body region, and a base current increases due to a carrier recombination on the basis of the channel generation. As a result, bipolar operation occurs effectively and a surge current flows to the metal wiring 31M through the source regions 31N and 33N.

According to the third preferred embodiment of the present invention, since the P type impurity regions 31P and 33P which fix the body potential are provided, the gate voltage can uniformly occur across the body regions of all the transistors which are formed across the active region between the source regions 31N and 33N, and the drain regions 32N and 34N. As a result, responses against the electrostatic surges can be equalized so that the surge current flows out each of the transistors uniformly, and the electrostatic protection property against the electrostatic surge can be improved.

And, according to the third preferred embodiment of the present invention, the P type (highly doped) impurity region 31P which is exposed from the gate electrode 30G is merely formed in the device in a manner well known as conventional semiconductor integrated devices. Therefore, an area of the semiconductor integrated device according to the third preferred embodiment is almost equal to that of the conventional semiconductor integrated device.

Furthermore, since the P type impurity region 31P is isolated from the source and drain regions 31N and 32N, and 33N and 34N, by the isolation regions 30F, a parasitic diode is not generated. Therefore, a diode current between the body region, the source regions 31N and 33N, and the drain regions 32N and 34N, can be prevented.

Figure 10:
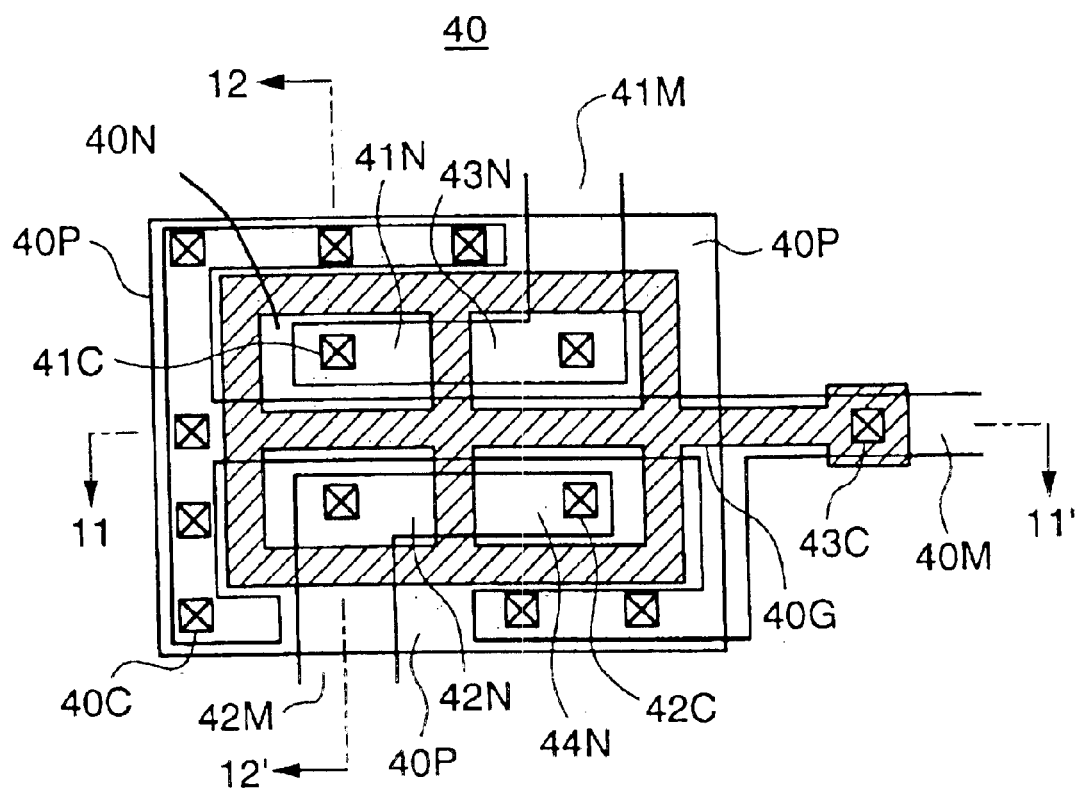
FIG. 10 is a plan view showing the structure of a semiconductor integrated device having an electrostatic breakdown protection circuit according to a fourth preferred embodiment of the present invention.
Figure 11:
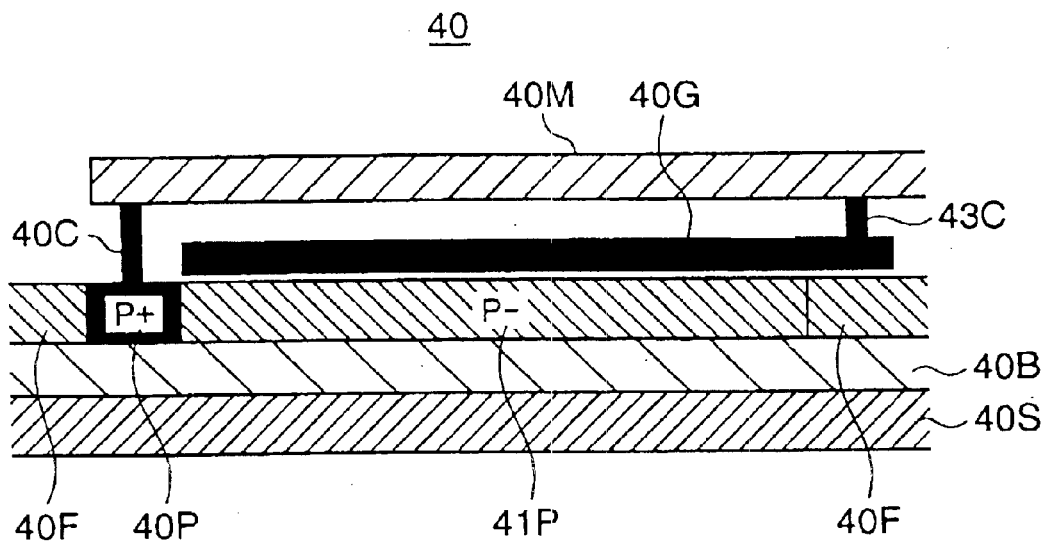
FIG. 11 is a cross-sectional view along the line 11–11' in FIG. 10, which shows the structure of the semiconductor integrated device having the electrostatic breakdown protection circuit according to the fourth preferred embodiment of the present invention.
Figure 12:
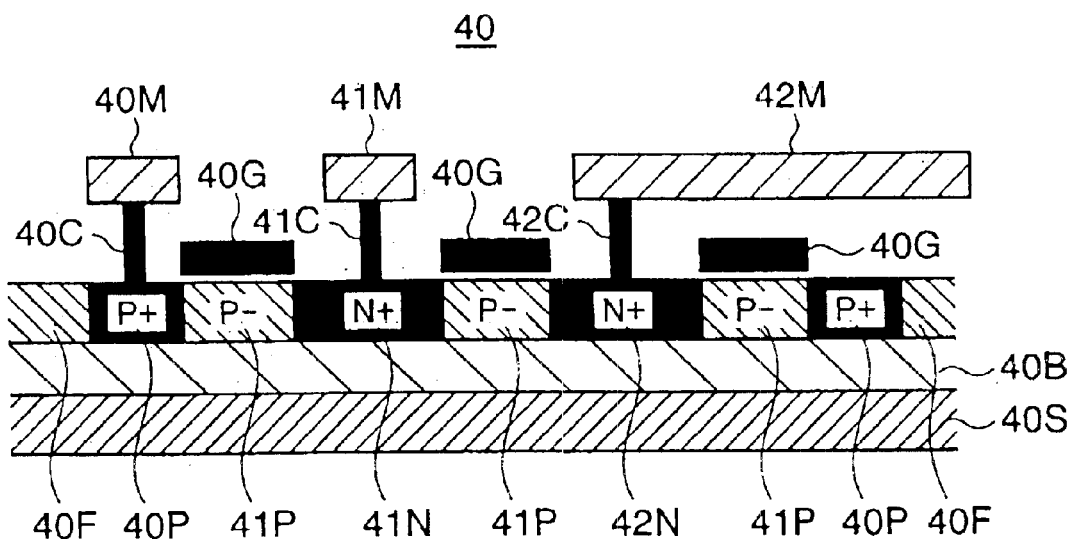
FIG. 12 is a cross-sectional view along the line 12–12' in FIG. 10, which shows the structure of the semiconductor integrated device having the electrostatic breakdown protection circuit according to the fourth preferred embodiment of the present invention.

FIG. 10 is a plan view showing the structure of a semiconductor integrated device 10 having an electrostatic breakdown protection circuit according to a fourth preferred embodiment of the present invention. FIG. 11 is a cross-sectional view along the line 11–11' in FIG. 10. FIG. 12 is a cross-sectional view along the line 12–12' in FIG. 10.

The semiconductor integrated device 40 is formed in an SOI substrate having a silicon substrate 40S, a BOX layer 40B which is formed on the silicon layer 40S, an N type impurity regions 41N, 42N, 43N and 44N which are isolated by the BOX layer 40B and an isolating region 40F (a field region 40F), and a highly doped P type impurity region 40P which is formed around the N type impurity regions 41N, 42N, 43N and 44N. Source regions 41N and 43N and drain regions 42N and 44N are formed in the N type impurity region 40N. A gate electrode 40G is formed over a low-doped P type impurity region 41P which is located between the source region 41N and the drain region 42N, the source region 43N and the drain region 44N, the source regions 41N and 43N, and the drain regions 42N and 44N. On the other hand, the low-doped P type impurity region 41P surrounds the source regions 41N and 43N and the drain regions 42N and 44N. A metal wiring 40M which supplies a gate potential overlaps with the gate electrode 40G and the highly doped P type impurity region 40P. A metal wiring 41M is electrically connected to the source regions 41N and 43N through contact holes 41C, and supplies a source potential to the source regions 41N and 43N. A metal wiring 42M is electrically connected to the drain regions 42N and 44N through contact holes 42C, and supplies a drain potential to the drain regions 42N and 44N. The gate electrode 40G is electrically connected to the metal wiring 40M over the field region 40F, thorough a contact hole 43C. The metal wiring 40M is also electrically connected to the highly doped P type impurity region 40P through contact holes 40C.

Next, an operation of the semiconductor integrated device 40 will be described below. When the electrostatic surge is applied from the metal wiring 42M to the drain regions 42N and 44N, a body potential rises due to a breakdown occurring between the source and drain regions 41N and 42N, and between the source and drain regions 43N and 44N. And, a gate potential rises through the highly doped P type impurity region 40P. At that time, a channel is generated in the body region between the source regions 41N and 43N, and the drain regions 42N and 44N (a boundary face) of the body region, and a base current increases due to a carrier recombination on the basis of the channel generation. As a result, bipolar operation occurs effectively and a surge current flows to the metal wiring 41M through the source regions 41N and 43N.

According to the fourth preferred embodiment of the present invention, since the highly doped P type impurity region 40P which fixes the body potential is formed around the N type impurity region 40N, all the transistors are turned on so that bipolar operation can uniformly occur across the body regions of all the transistors which are formed across the active region between the source regions 41N and 43N, and the drain regions 42N and 44N. As a result, responses against the electrostatic surges can be equalized so that the surge current flows out each of the transistors uniformly, and the electrostatic protection property against the electrostatic surge can be improved.

Figure 13:
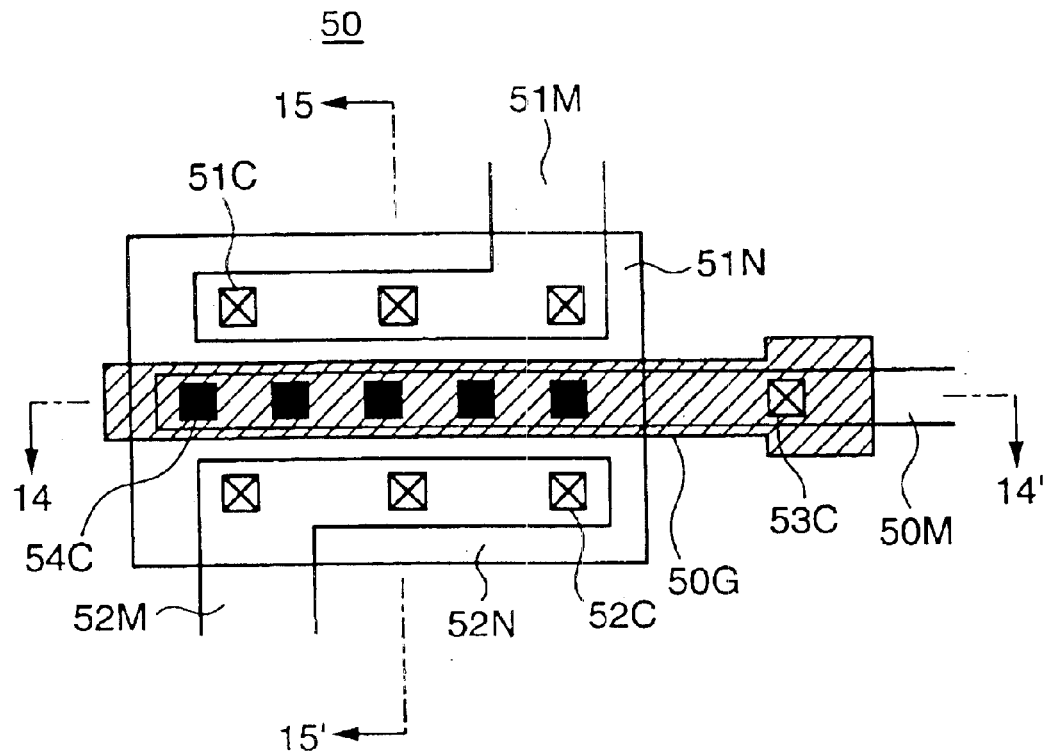
FIG. 13 is a plan view showing the structure of a semiconductor integrated device having an electrostatic breakdown protection circuit according to a fifth preferred embodiment of the present invention.
Figure 14:
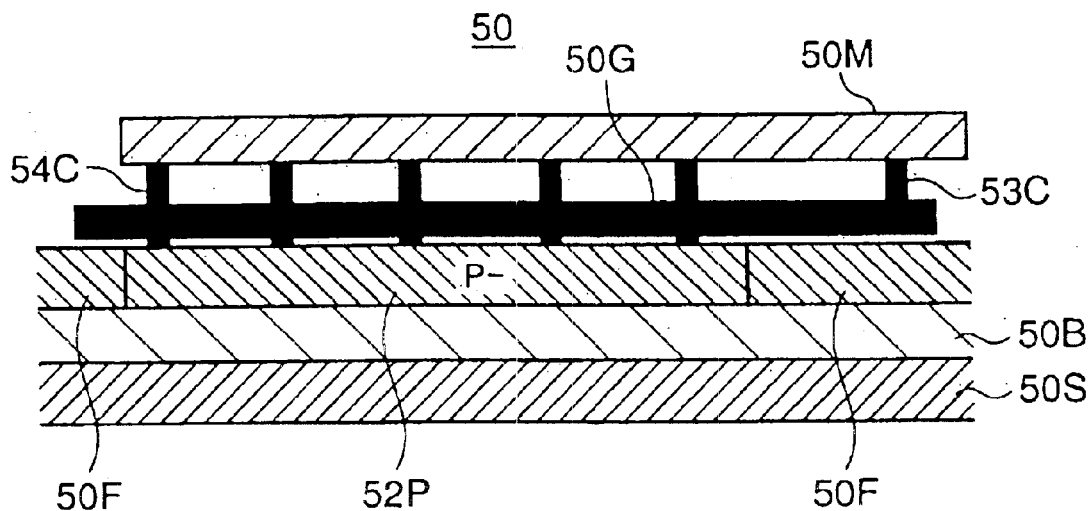
FIG. 14 is a cross-sectional view along the line 14–14' in FIG. 13, which shows the structure of the semiconductor integrated device having the electrostatic breakdown protection circuit according to the fifth preferred embodiment of the present invention.
Figure 15:
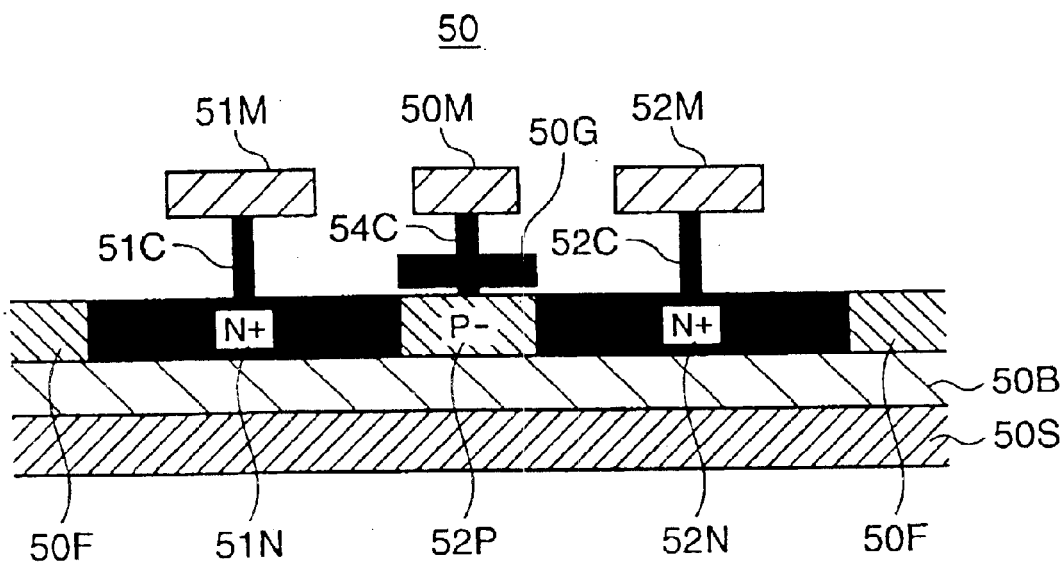
FIG. 15 is a cross-sectional view along the line 15–15' in FIG. 13, which shows the structure of the semiconductor integrated device having the electrostatic breakdown protection circuit according to the fifth preferred embodiment of the present invention.
Figure 16:
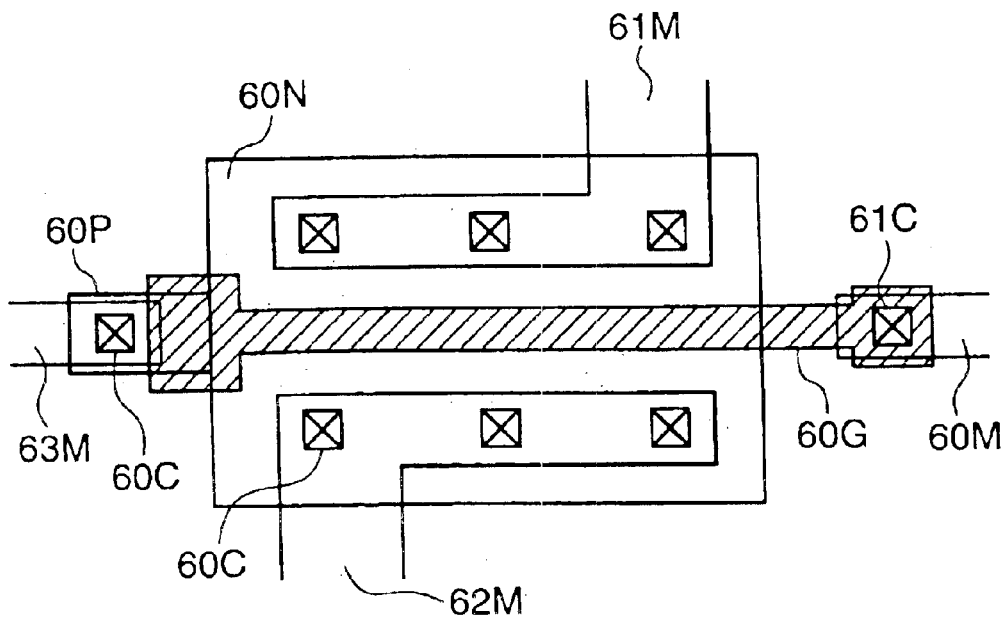
FIG. 16 is a plan view showing the structure of a conventional NMOS transistor which is a body contact type having an electrostatic breakdown protection circuit.
Figure 17:
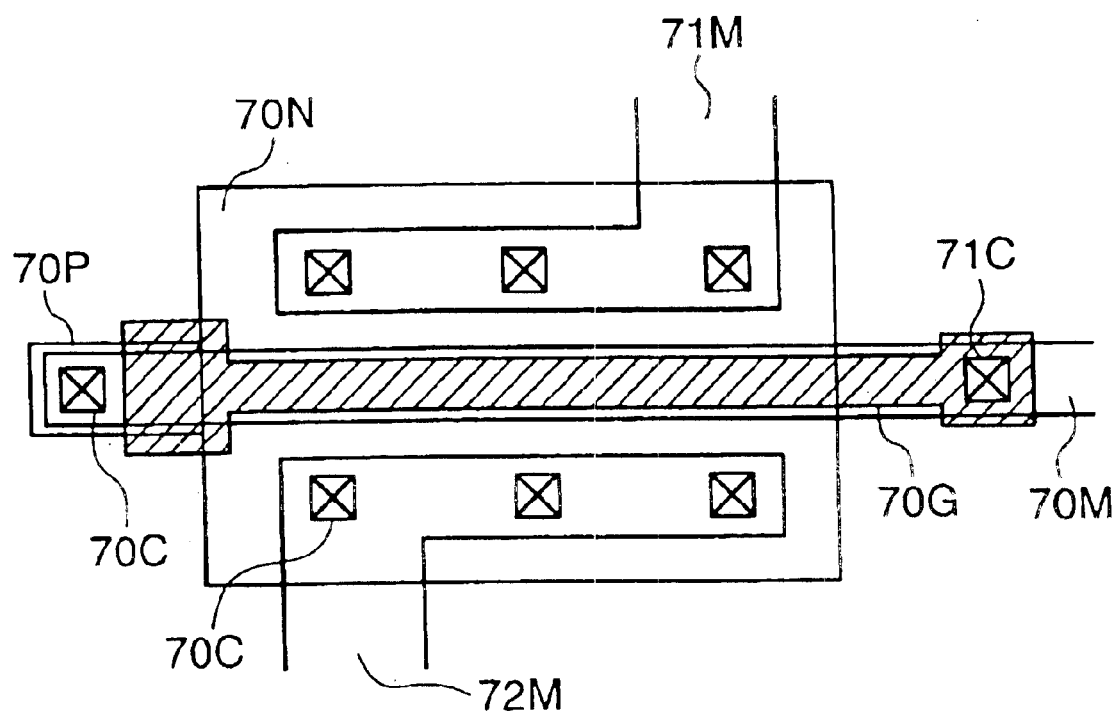
FIG. 17 is a plan view showing the structure of a conventional DTMOS transistor having an electrostatic breakdown circuit.

FIG. 13 is a plan view showing the structure of a semiconductor integrated device 10 having an electrostatic breakdown protection circuit according to a fifth preferred embodiment of the present invention. FIG. 14 is a cross-sectional view along the line 14–14' in FIG. 13. FIG. 15 is a cross-sectional view along the line 15–15' in FIG. 13.

The semiconductor integrated device 50 is formed in an SOI substrate having a silicon substrate 50S, a BOX layer 50B which is formed on the silicon layer 50S, N type impurity regions 51N and 52N which are isolated by the BOX layer 50B and an isolating region 50F (a field region 50F). A gate electrode 50G crosses over the P type body region in between the source and drain regions 51N and 52N. A metal wiring 50M which supplies a gate potential overlaps with the gate electrode 50G and extends along the gate electrode 50G. A metal wiring 51M is electrically connected to the source region 51N through contact holes 51C, and supplies a source potential to the source region 51N. A metal wiring 52M is electrically connected to the drain region 52N through contact holes 52C, and supplies a drain potential to the drain region 52N. A low-doped P type impurity region 52P is located between the source and drain regions 51N and 52N. The metal wiring 50M overlaps the low-doped impurity region 52P. The gate electrode 50G is electrically connected to the metal wiring 50M over the field region 50F, thorough a contact hole 53C. The metal wiring 50M is also electrically connected to the low-doped P type impurity region 52P through contact holes 54C which pierce through the gate electrode 50G.

Next, an operation of the semiconductor integrated device 50 will be described below. When the electrostatic surge is applied from the metal wiring 52M to the drain region 52N, a body potential rises due to a breakdown occurring between the source and drain regions 51N and 52N. And, a gate potential rises through the contact holes 54C. At that time, a channel is generated in the body region between the source and drain regions 51N and 52N (a boundary face) of the body region, and a base current increases due to a carrier recombination on the basis of the channel generation. As a result, bipolar operation occurs effectively and a surge current flows to the metal wiring 51M through the source region 51N.

According to the fifth preferred embodiment of the present invention, since the contact holes 54C which are electrically connected between the metal wiring 50M and the low-doped P type impurity region 52P which fixes the body potential are provided, all the transistors are turned on so that bipolar operation can uniformly occur across the body regions of all the transistors which are formed across the active region between the source and drain regions 51N and 52N. As a result, responses against the electrostatic surges can be equalized so that the surge current flows out each of the transistors uniformly, and the electrostatic protection property against the electrostatic surge can be improved.

And, according to the fifth preferred embodiment of the present invention, the contact holes 54C which are electrically connected between the metal wiring 50M and the low-doped P type impurity region 52P are merely formed in the device in a manner well known as conventional semiconductor integrated devices. Therefore, an area of the semiconductor integrated device according to the second preferred embodiment is almost equal to that of the conventional semiconductor integrated device.

As described above, in the semiconductor integrated device having an electrostatic breakdown protection circuit according to the present invention, the gate potential can be applied to the body region of all the transistors which are formed across the active region uniformly, and responses against the electrostatic surges can be equalized so that the surge current flows out each of the transistors uniformly. Therefore, the electrostatic protection property against the electrostatic surge can be improved. Furthermore, the present invention can provide the semiconductor integrated device such that an area of the semiconductor integrated device is almost equal to that of a conventional semiconductor integrated device.

The present invention has been described with reference to illustrative embodiments, however, this invention must not be considered to be confined only to the embodiments illustrated. Various modifications and changes of these illustrative embodiments and the other embodiments of the present invention will become apparent to those skilled in the art with reference to the description of the present invention. It is therefore contemplated that the appended claims will cover any such modifications or embodiments as fall within the true scope of the invention.

What is claimed is:

1. A semiconductor integrated device having an electrostatic breakdown protection circuit, comprising:

a source region and a drain region of a first conductive type formed in a semiconductor substrate having a first isolating region;

a channel region of a second conductive type which is formed between the source and drain regions;

a first impurity region of the second conductive type which is formed in the channel region between the source and drain regions, and which extends from a surface of the semiconductor substrate;

a second impurity region of the second conductive type which is formed in the channel region between the source and drain regions and which is adjacent to the first impurity region;

a third impurity region of the second conductive type which is formed outside and adjacent the channel region;

a gate electrode which is formed over the second impurity region of the channel region and not over the first impurity region; and a conductive layer extending over the gate electrode and the channel region, and electrically connected to the first impurity region, the third impurity region and the gate electrode.

wherein lateral sides of the first impurity region are in direct contact with the second impurity region.

2. The semiconductor integrated device according to claim 1, wherein the first impurity region is completely surrounded laterally by the second impurity region.

3. The semiconductor integrated device according to claim 1, wherein an ion concentration of the first and third impurity regions is higher than an ion concentration of the second impurity region.

4. The semiconductor integrated device according to claim 1, wherein the conductive layer extends along a same direction as the gate electrode.

5. The semiconductor integrated device according to claim 1, wherein the conductive layer is electrically connected to the gate electrode over the first isolating region.

6. The semiconductor integrated device according to claim 1, wherein the first isolating region extends to both side surfaces of the third impurity region facing the source and drain regions.

7. The semiconductor integrated device according to claim 1, wherein the source region includes sub-source regions, and the drain region includes sub-drain regions.

8. The semiconductor integrated device according to claim 7, further comprising:
second isolation regions which are respectively formed between the sub-source regions and the sub-drain regions.

9. The semiconductor integrated device according to claim 8, wherein the second isolation regions are formed adjacent the first impurity region.

10. The semiconductor integrated device according to claim 1, further comprising second isolating regions respectively formed between the first impurity region and the source region and between the first impurity region and the drain region.

11. The semiconductor integrated device according to claim 10, wherein the second isolating regions comprise an oxide.

12. The semiconductor integrated device according to claim 1, wherein the conductive layer is electrically connected to the first impurity region between the source and drain regions through an opening in the gate electrode.

13. A semiconductor integrated device having an electrostatic breakdown protection circuit, comprising:

a source region and a drain region of a first conductive type formed in a semiconductor substrate having a first isolating region;

a channel region of a second conductive type which is formed between the source and drain regions;

a first impurity region of the second conductive type which is formed in the channel region between the source and drain regions, and which extends from a surface of the semiconductor substrate;

a second impurity region of the second conductive type which is formed in the channel region between the source and drain regions and which is adjacent to the first impurity region;

a third impurity region of the second conductive type which is formed outside and adjacent the channel region;

a gate electrode which is formed over the second impurity region of the channel region and not over the first impurity region; and a conductive layer extending over the gate electrode and the channel region, and electrically connected to the first impurity region, the third impurity region and the gate electrode, wherein the first impurity region is not in direct contact with the source region.

* * * * *